United States Patent [19]

Heim

[11] Patent Number: 5,284,797
[45] Date of Patent: Feb. 8, 1994

[54] SEMICONDUCTOR BOND PADS

[75] Inventor: Dorothy A. Heim, San Jose, Calif.

[73] Assignee: LSI Logic Corporation, Milpitas, Calif.

[21] Appl. No.: 984,206

[22] Filed: Nov. 30, 1992

Related U.S. Application Data

[62] Division of Ser. No. 947,854, Sep. 18, 1992, Pat. No. 5,248,903.

[51] Int. Cl.⁵ .............................................. H01L 21/44
[52] U.S. Cl. ............................ 437/183; 437/182; 437/184; 437/189; 437/195; 437/203; 437/209
[58] Field of Search ............... 437/209, 203, 195, 183, 437/184, 182, 189; 257/751, 758

[56] References Cited

U.S. PATENT DOCUMENTS

| | | | |
|---|---|---|---|
| 4,057,659 | 11/1977 | Pammer et al. | 257/758 |
| 4,742,023 | 5/1988 | Hasegawa | 437/183 |
| 4,843,453 | 6/1989 | Hooper et al. | 257/751 |
| 4,914,054 | 4/1990 | Moriyama et al. | 437/183 |
| 4,924,294 | 5/1990 | Tanielian | 257/751 |
| 4,965,218 | 10/1990 | Geissberger et al. | 437/195 |
| 5,166,096 | 11/1992 | Cote et al. | 437/195 |
| 5,169,802 | 12/1992 | Yeh | 437/203 |

Primary Examiner—Tom Thomas
Assistant Examiner—Kevin M. Picardat
Attorney, Agent, or Firm—Gerald E. Linden; Michael D. Rostoker

[57] ABSTRACT

Bond pad lift problems encountered during bonding are alleviated by providing an upper bond pad, a lower bond pad and an insulating component between the upper and lower bond pads. At least one opening is provided through the insulating component, extending from the bottom bond pad to the upper bond pad. The at least one opening is aligned with a peripheral region of the bottom bond pad. Conductive material fills the at least one opening, and electrically connects the top and bottom bond pads. In one embodiment, the at least one opening is a plurality of conductive vias. In another embodiment, the at least one opening is a ring-like opening extending around the peripheral region. In yet another embodiment, the at least one opening is one or more elongated slit-like openings.

18 Claims, 3 Drawing Sheets

SEMICONDUCTOR BOND PADS

CROSS-REFERENCE TO RELATED APPLICATIONS

This application is a division of U.S. patent application Ser. No. 07/947,854 filed Sep. 18, 1992 now U.S. Pat. No. 5,248,903.

TECHNICAL FIELD OF THE INVENTION

The invention relates to making connections to integrated circuit (IC) devices (semiconductor dies), particularly to the "bond pads" on the die.

BACKGROUND OF THE INVENTION

Integrated circuit devices comprise a semiconductor die having a variety of diffusions and overlying layers forming circuit elements, gates and the like. Generally, the penultimate layers fabricated on the die are conductive metal layers ("M") having patterns of conductive lines. Two or more metal layers ("M1", "M2", etc.) are separated by a dielectric layer of inter-layer dielectric (ILD). For purposes of this discussion, it is assumed that there are two conductive layers, a layer designated "M1", and a layer designated "M2". An ILD layer overlies the M1 layer, and the M2 layer overlies the ILD. Typically, a topmost passivation layer is applied over the M2 layer. Openings through this passivation layer expose areas of the M2 layer. These exposed areas are termed "bond sites". Connections to the die, hence to the circuitry contained on the die, are effected with these exposed areas. For example, bond wires may be bonded directly to the bond sites, or gold bumps may be formed on the bond sites for tape-automated bonding to the die, or gold balls may be formed on the exposed areas for flip-chipping the die to a substrate. This is all well known.

FIGS. 1A and 1B illustrate the structure of a prior art "composite bond pad" 100. Typically, a plurality of such bond pads would be disposed on a die. A partially-fabricated semiconductor die 102, having various diffusions and depositions (not shown), has a top surface 103. A layer 104 of insulating material (e.g., silicon dioxide) is formed on the surface 103. A patterned layer 106 of "barrier metal" is applied over the oxide 104. A patterned conductive layer 108 of "first" metal ("M1") is applied over the barrier metal 106, and is connected (not shown) to circuit elements (not shown) contained on the die. A layer 110 of inter-layer dielectric ("ILD"; e.g., silicon dioxide) is applied over the first metal layer 108, and is provided with an opening 112 extending through the layer 110 to the top surface (as viewed in the Figure) of the underlying M1 layer. A patterned conductive layer 114 of "second" metal ("M2") is applied over the ILD 110, and a portion 116 of this layer 114 forms a conductive "plug" filling the opening 112. A topmost "passivation" layer 118 (e.g., Borophosphosilicate Glass, or BPSG) is applied over the M2 and ILD layers, and is provided with an opening 120 extending through the passivation layer 118 to the top surface (as viewed in the Figure) of the underlying M2 layer. This leaves an area 120 of the top surface of the M2 layer exposed. The area 120 is termed the "contact area" ("bond site"). It is in this contact area that external connections to the die will be made, by any suitable means such as bond wires. Alternatively, gold bumps (not shown) or gold balls (not shown) can be formed atop the area 120, for tape-automated (TAB) bonding or flip-chip bonding to the die.

In aggregate, the elements 114, 116 and 108 comprise the "composite bond pad" 100. For purposes of this discussion, the portion of the metal layer 114 above dashed line 115 is termed "upper bond pad", and the portion of the lower metal layer 108 underlying the upper bond pad is termed "lower bond pad". The use of a barrier metal layer (106) underneath the bond pad (i.e., underneath the M1 layer) is optional, and offers certain protection against diffusion into the M1 layer of "fugitive" species (contaminants, vis-a-vis the M1 layer) from underlying layers in the die.

As best viewed in FIG. 1B, the (composite) bond pad 100 is generally square (it is shown in the Figure as a slightly elongated rectangle), and has dimensions on the order of $100 \times 100$ μm (microns). Further, the upper bond pad may be larger than the "plug" 114. For example, if the upper bond pad measures 100 μm across, the plug may measure only 80–90 μm across. As is evident, only the outer peripheral region (for example the outermost 10% of the upper bond pad) of the upper bond pad rests on the ILD 110.

In practice, the lower bond pad element 108 may be a defined portion (shown as a slightly elongated rectangle) of a conductive line of the M1 layer.

In practice, a plurality of bond pads (100) are disposed on the top surface of the die, for making a plurality of input/output (I/O) connections to the die.

As mentioned above, ultimately the contact area 120 is bonded to, whether with a bond wire, or by the mechanism of gold bumps/balls. These various processes typically impart mechanical and or thermal energy directly onto the bond pad, especially in the contact area. It has been observed that these bonding processes, can cause the bond pad to delaminate (lift) from the underlying surfaces of multiple metal layers (e.g., 106) and oxide (e.g., 104). This bond pad lift problem can happen in all different kinds of bonding technology, such as aluminum wire bond, gold ball bonding, gold bump bonding, and others. This bond pad lift problem can become exacerbated when using an underlying layer of barrier metal (106), such as titanium (Ti), titanium nitride (TiN), Titanium-Tungsten (TiW), and the like, under the bond pads. Bond pad lift is very undesirable, and can result in potential problems in both assembly (packaging) yield and device reliability.

In the past, efforts to alleviate bond pad lift have been directed to: (1) adjusting bonding process parameters to minimize the thermal and/or mechanical shock to the bond pad; and (2) optimizing the barrier metal layer materials and deposition technology. These efforts have met with only partial success, and impose undesirable constraints (i.e., a narrow window of process parameters) on the bonding process.

DISCLOSURE OF THE INVENTION

It is an object of the present invention to provide an improved integrated circuit device.

It is a further object of the present invention to provide an improved bond pad structure for semiconductor devices.

It is a further object of the present invention to reduce bond pad lift, without narrowing the window of bonding process parameters.

According to the invention, a composite bond pad includes an upper bond pad, a lower bond pad and an insulating component between the upper and lower bond pads. At least one opening is provided through the insulating component, extending from the bottom bond pad to the upper bond pad. This at least one opening is aligned with a peripheral region of the bottom bond pad. Conductive material fills the at least one opening, and electrically connects the top and bottom bond pads.

In one embodiment of the invention, the at least one opening is a plurality of vias. Each via may measure approximately one micron in cross-section. The vias may extend in at least one "string" (row) around the peripheral region of the lower bond pad. If there are two or more strings of vias, the vias of one string are preferably offset from the vias of another adjacent string.

In another embodiment of the invention, the at least one opening is a ring-like opening extending around the peripheral region. The ring-like opening preferably has a diameter slightly smaller than the minimum cross sectional dimension of the bottom bond pad.

In yet another embodiment of the invention, the at least one opening is one or more elongated slit-like openings. In the case of two of these elongated slit-like openings, they may be disposed across from one another vis-a-vis the area defined by the lower bond pad.

Other objects, features and advantages of the invention will become apparent in light of the following description thereof.

DETAILED DESCRIPTION OF THE INVENTION

Figure 1A:
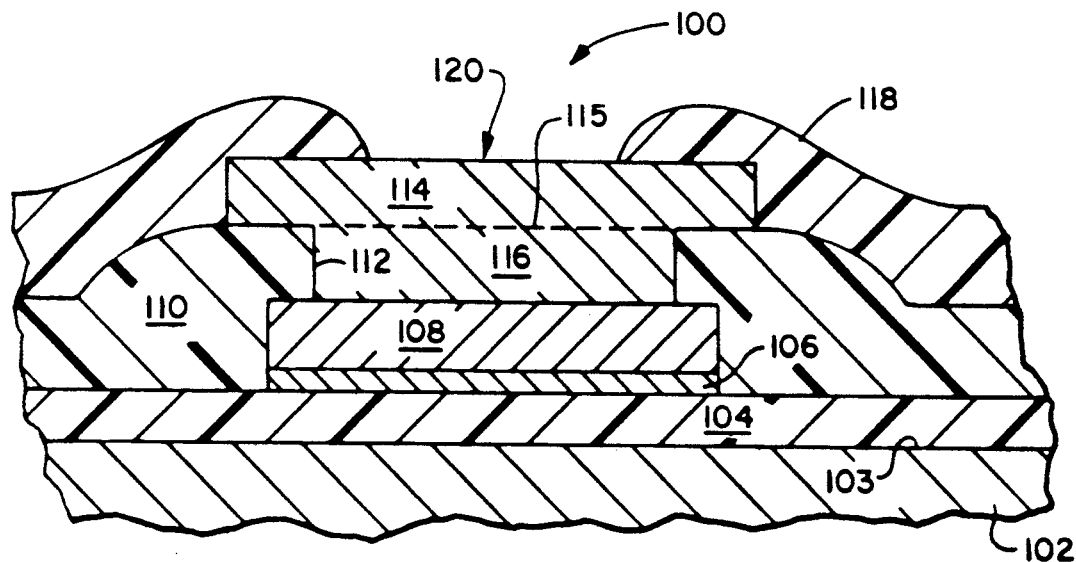
FIG. 1A is a cross-sectional view of a prior art bond pad.
Figure 1B:
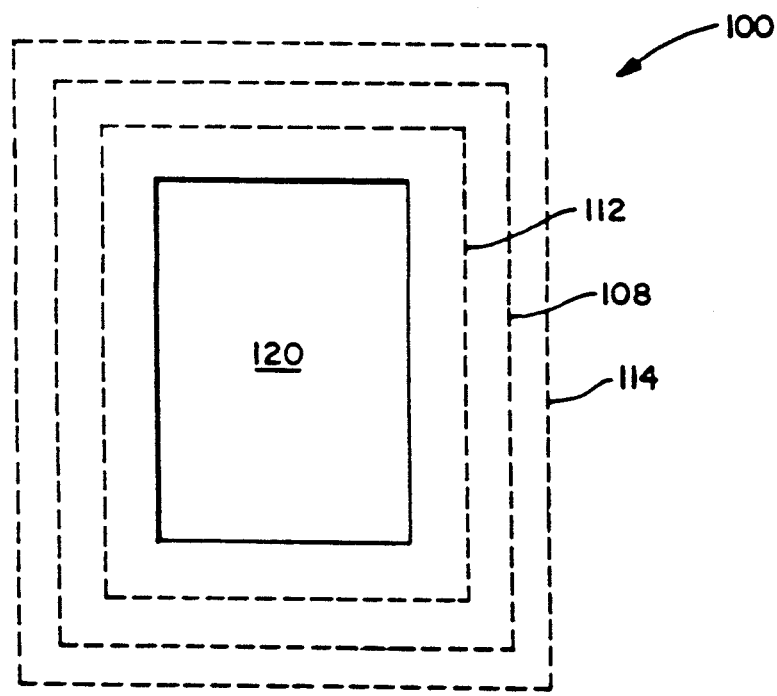
FIG. 1B is a plan view of the bond pad of FIG. 1A.

FIGS. 1A and 1B show a prior art bond pad structure, and have been discussed in detail hereinabove. Particularly, the problem of bond pad lift, using a large plug (116) between M2 (114) and M1 (108), was discussed.

According to the present invention, a connection between M2 and M1 is made only around a small peripheral portion (band) of the bond pad.

Figure 2A:
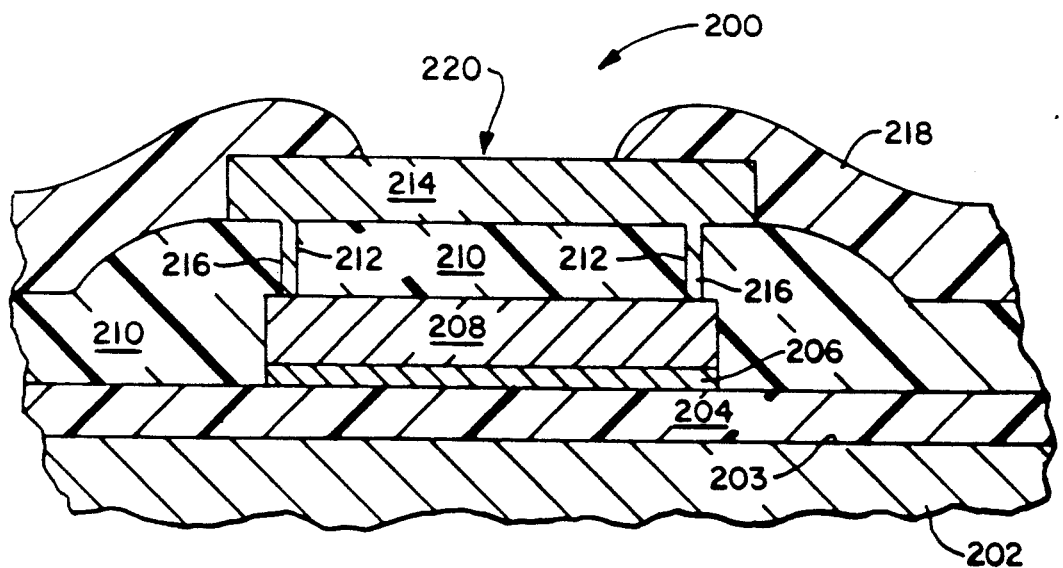
FIG. 2A is a cross-sectional view of an embodiment of a bond pad according to the present invention.
Figure 2B:
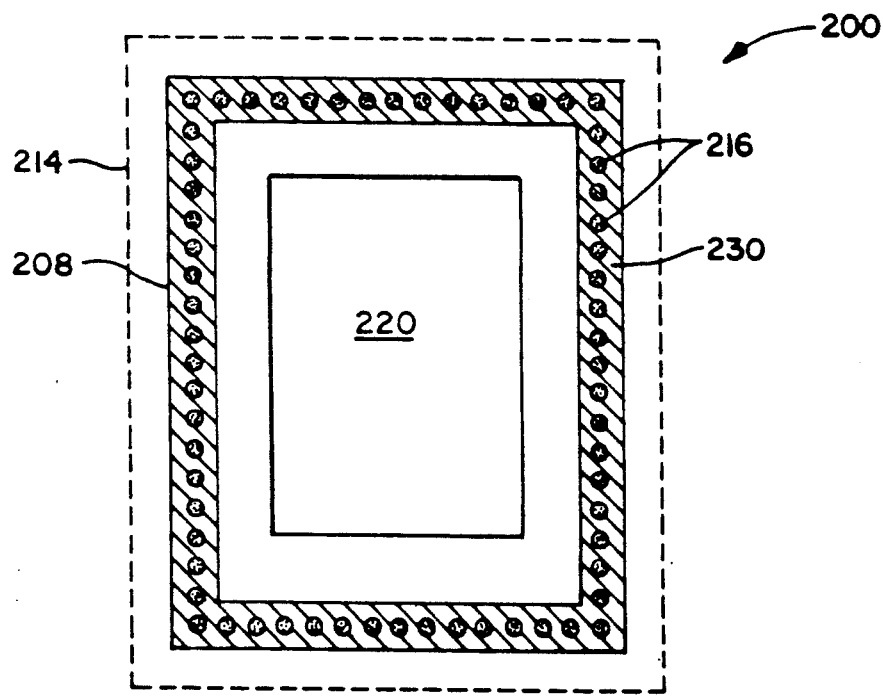
FIG. 2B is a top plan view of the bond pad of FIG. 2A.

FIGS. 2A and 2B illustrate the structure of the composite bond pad 200 of the present invention. A partially-fabricated semiconductor die 202, having various diffusions and depositions (not shown), has a top surface 203. A layer 204 of insulating material (e.g., silicon dioxide) is formed on the surface 203. A patterned layer 206 of "barrier metal" is applied over the oxide layer 204. A patterned conductive layer 208 of "first" metal ("M1") is applied over the barrier metal 206, and is connected (not shown) to circuit elements (not shown) contained on the die. A defined area of this M1 layer (best viewed in FIG. 2B) forms the lower bond pad element. A layer 210 of inter-layer dielectric ("ILD"; e.g., silicon dioxide) is applied over the first metal layer 208, and is provided with a plurality of small openings (vias) 212 extending through the layer 210 to a peripheral region of the lower bond pad 208. A patterned conductive layer 214 of "second" metal ("M2") is applied over the ILD 210, and a portion 216 of this layer 214 fills the openings 212. Alternatively, the openings 212 can be filled by selective deposition of a metal such as tungsten. The portion of the layer 214 overlying the ILD 210 is the upper bond pad element. A topmost "passivation" layer 218 (e.g., Borophosphosilicate Glass, or BPSG) is applied over the M2 and ILD layers, and is provided with an opening 220 extending through the passivation layer 218 to the top surface (as viewed in the Figure) of the underlying M2 layer. This leaves an area 220 of the top surface of the M2 layer exposed. The area 220 is termed the "contact area". As in the prior art, it is in this contact area (220) that external connections to the die will be made, by any suitable means such as bond wires. Alternatively, gold bumps (not shown) or gold balls (not shown) can be formed atop the area 220, for tape-automated (TAB) bonding or flip-chip bonding to the die.

In aggregate, the upper bond pad element 214, the lower bond pad element 208, that portion of the ILD 210 between the upper and lower bond pad elements, and the conductive material filling the opening 212 comprise the "composite bond pad" 200, per se. The use of a barrier metal layer (206) underneath the bond pad (i.e., underneath the M1 layer) is optional.

As best viewed in FIG. 2B, the bond pad 200 is generally square (shown slightly elongated), and has dimensions on the order of $100 \times 100$ μm. Attention is directed to a peripheral region 230 (shown shaded in FIG. 2B) of the lower bond pad element 208. The peripheral region 230 extends from the periphery of the area of the M1 layer defined as the lower bond pad 208, to approximately less than 10% (e.g., 10 μm) towards the center of the lower bond pad. Preferably, the peripheral region 230 is disposed entirely outside of the contact area 220. For example, if the lower bond pad element measures 100 μm across, the peripheral region may form a band only approximately 10 μm around the periphery of the lower bond pad element.

The vias 212 are illustrated in FIG. 2B as a single row ("string") of filled (216) vias extending around the periphery of the lower bond pad element, within the peripheral region 230. While shown as cylindrical (round cross-section), the vise may have any suitable cross-section, such as square, in which case they would be square columns. The cross-sectional dimension of the filled vias 216 is preferably on the order of 1.0–1.5 μm, and they are preferably spaced apart from one another by approximately 2.0–3.0 μm.

As best viewed in FIG. 2A, by using a plurality of small vias 212 around the periphery of the bond pad, rather than the single large plug (112, FIG. 1A), the space between the upper and lower bond pad elements is substantially entirely (i.e., 90% or more) filled with ILD oxide 210.

As in the prior art, a plurality of composite bond pads (200) are disposed on the top surface of the die, for making a plurality of input/output (I/O) connections to the die.

It is possible to repeat the "metal-ILD-metal" structure any number of times to form a multilayer metallization structure. Thus, the composite bond pads of the present invention can be used to interconnect several levels of metal.

As in the prior art, ultimately the contact area 220 is bonded to, whether with a bond wire, or by the mechanism of gold bumps/balls. These various processes typically impart mechanical and or thermal energy directly onto the bond pad, especially in the contact area. It has been determined that the "metal-ILD-metal" (i.e., 214-210-208) structure of a composite bond pad of the present invention exhibits substantially less bond pad lift off problems than the "metal-metal-metal" (i.e., 114-116-108) composite bond pad structure of the prior art, especially when a barrier layer (106, 206) is employed. The composite bond pad structure of the present invention will thus exhibit a desirable improvement in both assembly (packaging) yield and device reliability.

ALTERNATE EMBODIMENTS

Figure 3A:
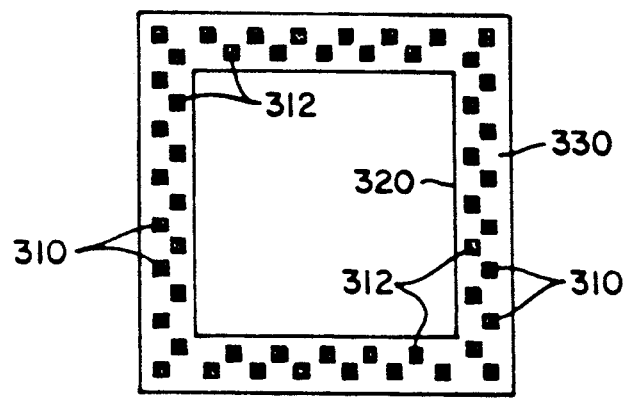
FIG. 3A is a top diagrammatic view of another embodiment of a bond pad, according to the present invention.

FIG. 3A shows an alternate embodiment of the invention. Two rows (strings) of filled vias are disposed all around the peripheral region 330 (analogous to 230). The inner edge of the peripheral region extends no further inward that the contact area 320 (analogous to 220). In the example, the vias are square in cross-section, and the vias in one string 310 are offset (staggered) from the vias of the adjacent string 312.

Figure 3B:
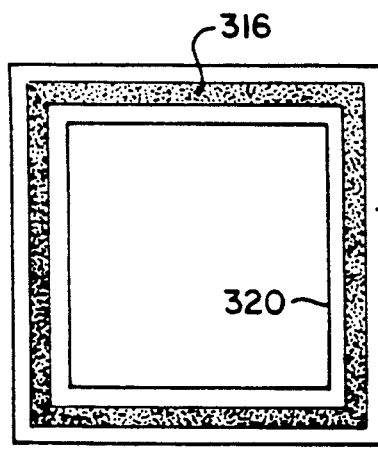
FIG. 3B is a top diagrammatic view of yet another embodiment of a bond pad, according to the present invention.

FIG. 3B shows yet another embodiment of the invention. A ring-like slit (through the ILD, not shown) is filled with conductive material 316 forming a continuous ring around the peripheral region 330.

Figure 3C:
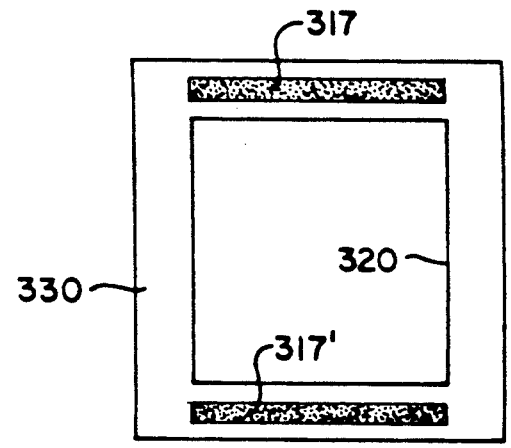
FIG. 3C is a top diagrammatic view of yet another embodiment of a bond pad, according to the present invention.

FIG. 3C shows yet another embodiment of the invention. Two elongated slits (through the ILD, not shown) are filled with conductive material 317, 317', on opposing sides of the peripheral region 330.

What is claimed is:

1. A method of making a composite bond pad, on a semiconductor die, of the type suitable for effecting making connections to the semiconductor die, said method comprising:
   forming a lower bond pad element having a top surface on a surface of a semiconductor die, the top surface of the lower bond pad element having an area and a peripheral region of the area;
   forming an insulating component over said top surface of said lower bond pad element;
   forming at least one opening through said insulating component, said opening extending to said top surface of said lower bond pad element, wherein said opening is located above the peripheral region of the top surface of said lower bond pad;
   filling said opening with conductive material; and
   forming an upper bond pad element above said insulating component, wherein said upper bond pad element is electrically connected to said conductive material and said lower bond pad element;
   wherein:
   the upper bond pad element is disposed higher above the surface of the semiconductor die than the lower bond pad element;
   in aggregate, the upper bond pad element, the lower bond pad element, the insulating component and the conductive material comprise a composite bond pad suitable for effecting making connections to the semiconductor die.

2. The method of claim 1, wherein:
   said upper bond pad element and said conductive material are deposited in a single step.

3. The method of claim 1, wherein:
   said conductive material is selectively deposited in said at least one opening.

4. The method of claim 1, wherein:
   the at least one opening is a plurality of vias extending around the peripheral region of the top surface area of the lower bond pad element.

5. The method of claim 1, wherein:
   the at least one opening is a two strings of vias extending all around the peripheral region of the top surface area of the lower bond pad element.

6. The method of claim 5, wherein:
   the vias in one string are offset from the vias in the other string.

7. The method of claim 1, wherein:
   the at least one opening is a ring-like slit extending continuously around the peripheral region of the top surface area of the lower bond pad element.

8. The method of claim 1, wherein:
   the at least one opening is two elongated slits disposed on opposite side areas of the peripheral region of the top surface area of the lower bond pad element.

9. Method of forming composite bond pads for semiconductor device comprising, for each composite bond pad:
   forming a lower bond pad element having a top surface with a first area;
   forming an upper bond pad element having a bottom surface with a second area, the upper bond pad element aligned atop and spaced apart from the lower bond pad element;
   wherein a volumetric space is defined between the top surface of the lower bond pad element and the bottom surface of the upper bond pad element;
   disposing an insulating component between the upper and lower bond pad elements, the insulating component substantially filling the volumetric space between the top surface of the lower bond pad element and the bottom surface of the upper bond pad element;
   forming at least one opening through the insulating component, extending from the upper bond pad element to the lower bond pad element, and aligned with a peripheral region of the bottom bond pad element; and
   filling the at least one opening with conductive material electrically connecting the upper bond pad element to the lower bond pad element;
   wherein the peripheral region extends from a periphery of the first area to approximately less than 10% towards a center of the first area on the top surface of the lower bond pad.

10. Method, according to claim 9, wherein:
    the at least one opening is a plurality of vias.

11. Method, according to claim 10, wherein:
    each via measures approximately one micron in cross-section.

12. Method, according to claim 10 wherein:
    the plurality of vias extend in at least one "string" around the peripheral region.

13. Method, according to claim 12, wherein:
    the plurality of vias extend in two or more strings around the peripheral region.

14. Method, according to claim 13, wherein:
    the two or more strings of vias are disposed so that the vias of one string are offset from the vias of another adjacent string.

15. Method, according to claim 9, wherein:
the at least one opening is a ring-like opening extending around the peripheral region.

16. Method, according to claim 9, further comprising:
forming a barrier metal layer beneath said lower bond pad.

17. Method, according to claim 16, wherein:
said barrier metal is selected from titanium, titanium nitride and titanium tungsten.

18. Method, according to claim 9, wherein:
the at least one opening has a third area, and the third area is less than 10% of the first area.

* * * * *